United States Patent [19]

Mori et al.

[11] Patent Number: 5,425,793
[45] Date of Patent: Jun. 20, 1995

[54] COUPLING-TYPE CLEAN SPACE APPARATUS

[75] Inventors: Kazuhiro Mori; Yoshiyuki Kubota, both of Katano; Naoyuki Hashimoto; Tatsuki Nogiwa, both of Hirakata, all of Japan

[73] Assignee: Matsushita Electric Industrial Co., Ltd., Osaka, Japan

[21] Appl. No.: 17,375

[22] Filed: Feb. 9, 1993

[30] Foreign Application Priority Data

Feb. 13, 1992 [JP] Japan .................................. 4-026451

[51] Int. Cl.$^6$ .............................................. B01D 50/00
[52] U.S. Cl. ...................... 55/385.2; 55/356; 55/473; 454/187; 454/188; 454/191
[58] Field of Search .................. 55/385.2, 472–473, 55/DIG. 29, 356; 454/187–188, 191

[56] References Cited

U.S. PATENT DOCUMENTS

| | | | |
|---|---|---|---|
| 3,059,563 | 10/1962 | Larson | 454/188 |
| 3,331,303 | 7/1967 | Gladd et al. | 454/188 |
| 3,777,736 | 12/1973 | Van Der Waaij et al. | 55/385.2 X |
| 4,693,175 | 9/1987 | Hashimoto | 55/385.2 X |
| 4,694,736 | 9/1987 | Yamagata et al. | 55/385.2 X |
| 4,699,640 | 10/1987 | Suzuki et al. | 55/385.2 |
| 4,732,592 | 3/1988 | Spengler | 59/385.2 X |
| 4,823,680 | 4/1989 | Nowotarski | 454/188 |
| 4,838,150 | 6/1989 | Suzuki et al. | 55/385.2 X |
| 4,851,018 | 7/1989 | Lazzari et al. | 55/385.2 X |
| 4,873,914 | 10/1989 | Hirayama | 55/385.2 X |
| 5,064,457 | 11/1991 | Weber | 59/385.2 |
| 5,072,658 | 12/1991 | Bogage | 454/188 |
| 5,096,477 | 3/1992 | Shinoda et al. | 55/385.2 |

*Primary Examiner*—Robert J. Warden
*Assistant Examiner*—Krisanne M. Thornton
*Attorney, Agent, or Firm*—Wenderoth, Lind & Ponack

[57] ABSTRACT

According to the present invention, chamber units are sequentially coupled with each other to thereby provide a volume of clean space, and whereby different environments can be maintained in the different chamber units. An air blowhole or door is provided at an opening section of each chamber unit. Moreover, a space section can be defined at the coupling part of the chamber units, and a suction pump and a suction hose can be provided in the space section, so as to prevent the environments of the different chambers from influencing one another.

22 Claims, 6 Drawing Sheets

COUPLING-TYPE CLEAN SPACE APPARATUS

BACKGROUND OF THE INVENTION

The present invention generally relates to a coupling-type clean space apparatus, and more specifically, a clean space apparatus which is designed to produce a clean space, which is nearly free of contamination from dust or the like, for a production line for producing semiconductor devices, comprising chamber units of constant internal volume coupled together one by one to thereby constitute a clean space channel of a desired volume.

In a production line for semiconductor devices or other kinds of super-precision products, even a slight amount of fine particles adversely influences the quality and performance of the products. Therefore, the products are manufactured in a so-called clean room from which airborne dust has been substantially removed.

A vast volume of space having a single environment can be cleaned at one time in the above-described manner. However, if it is necessary to change the environment for different kinds of products or manufacturing steps, it is quite difficult to set and divide the interior of the clean space into sections of individually different environments. This is not easy from a constructional viewpoint. Moreover, an operator may not be allowed to enter the clean space having an atmosphere of a specific gas such as nitrogen gas or the like.

As described hereinabove, although it is a necessary condition to section the interior of the clean space into different types of environments in the production line of semiconductors and the like, it causes the layout not to be changed and the structure to be complicated, as well as accompanying safety problem for the operator. Furthermore, when partitions are provided in the interior of the clean space, it is difficult for operators to enter the interior of the clean space for maintenance due to obstruction by the partitions.

SUMMARY OF THE INVENTION

The object of the present invention is therefore to provide a coupling-type clean space apparatus for which the environment therein can be easily set for each individual purpose.

In accomplishing the above and other objects, according to the first aspect of the present invention, there is provided a coupling-type clean space apparatus comprising:

chamber units sequentially coupled to one another to thereby form a fixed volume of clean space and having an air circulating means, and a dust removing means;

each of the chamber units having an air blowhole provided at an opening section of the chamber unit through which the chamber unit is coupled to an adjacent chamber unit, the air blowhole blowing air in a direction traversing the opening section so as to separate internal spaces of the coupled chamber units.

According to a second aspect of the present invention, there is provided a coupling-type clean space apparatus comprising:

chamber units sequentially coupled to one another to thereby form a fixed volume of clean space and having an air circulating means, and a dust removing means;

each of the chamber units having a freely openable door provided between opening sections of the coupled chamber units through which one chamber unit is coupled to an adjacent chamber unit so as to allow for separation of the internal spaces of the coupled chamber units by shutting the doors.

BRIEF DESCRIPTION OF THE DRAWINGS

These and other objects and features of the present invention will become clear from the following description taken in conjunction with the preferred embodiments thereof with reference to the accompanying drawings, in which.

A coupling-type clean space apparatus of the present invention will be discussed hereinbelow with reference to the accompanying drawings.

DETAILED DESCRIPTION OF THE PREFERRED EMBODIMENTS

Figure 1:
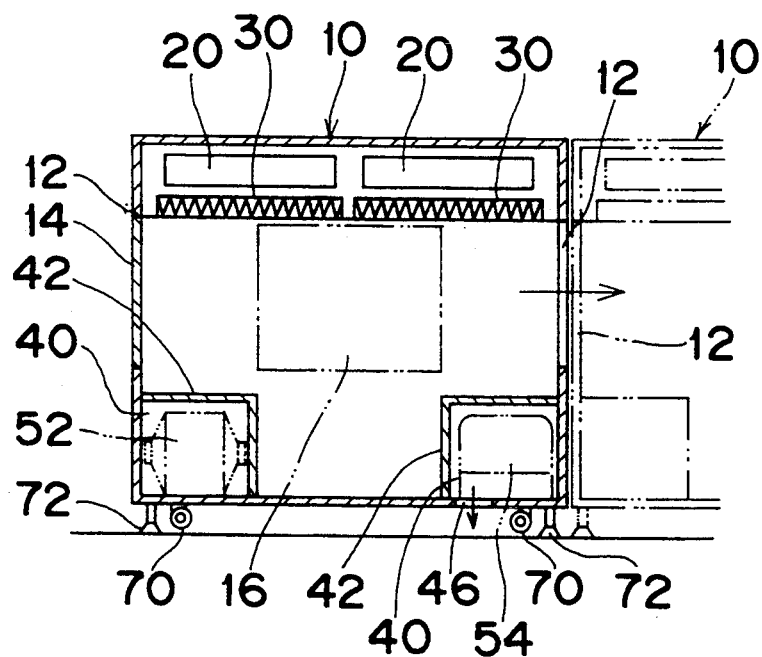
FIG. 1 is a sectional view of a chamber unit of a coupling-type clean space apparatus according to a first embodiment of the present invention.

Before the description of the present invention proceeds, it is to be noted that like parts are designated by like reference numerals throughout the accompanying drawings.

Figure 2:
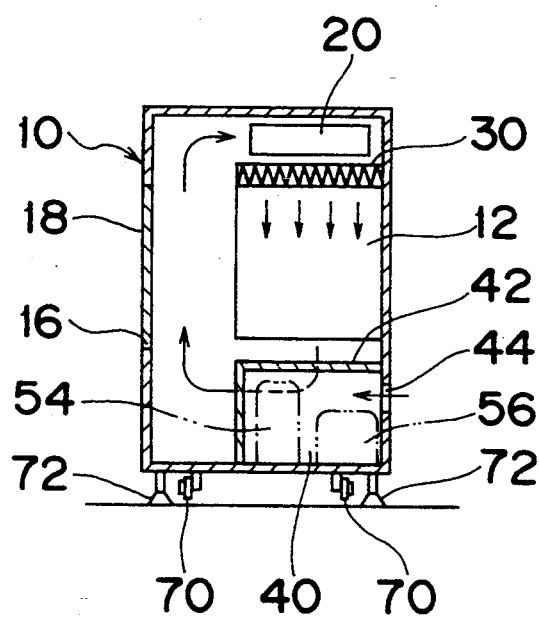
FIG. 2 is a sectional view of a coupling-type clean space apparatus of the first embodiment in a direction orthogonal to the sectional view of FIG. 1.

FIGS. 1 and 2 show the structure of a chamber unit constituting the coupling-type clean space apparatus of one embodiment of the present invention. The chamber unit 10 is generally a rectangular box-like body. Fan units 20 as an air circulating means are provided close to the ceiling inside the chamber unit 10. The fan units 20 suck air from the lateral side and blow a uniform flow of the air out from the lower surface thereof. Air filters 30 as a dust removing means are placed below the fan units 20. The space below the air filters 30 serves as a working space for various kinds of operations handled in the chamber unit 10. As the air in the chamber unit 10 runs in convection, dust in the air is removed by the air filters 30, so that the air is maintained pure at all times.

Any necessary equipment (not shown) such as a transferring means for processed articles or articles to be processed, various kinds of processing devices, etc. can be installed in the chamber unit 10. The space where the articles and processing devices are set is kept clean and without dust by means of a purifying means which is comprised of the above air filters 30 and fan units 20, etc.

A space 40 to install an air conditioning means is defined in the chamber unit 10, and is segregated from the above clean space. The air conditioning means, which is an air conditioner used in a general clean space apparatus, adjusts and controls the temperature and humidity in each fixed range. More specifically, the air conditioning means is a cooler comprising a cooling coil, a drain pan, a freezer capacitor, etc. or a heater to adjust the temperature, or a dehumidifier or a humidifier to adjust the humidity. The space 40 is of a sufficient size to accommodate the above air conditioning means. The space 40 is formed in the vicinity of the floor of the chamber unit 10, that is, where it does not obstruct the operations carried out in the chamber unit 10, and is separated by a partition 42 or the like from the clean space of the chamber unit 10 so as not to permit fine particles or contaminated air to enter. However, a surface of the partition 42 is exposed to the clean space to allow for heat exchange between the air conditioning means and the clean space. A vent is opened through the outer wall of the chamber unit 10 to take outside air in the air conditioning means or discharge air from the air conditioning means. Moreover, an opening part may be provided on the chamber unit 10 to insert devices therethrough or for the purpose of maintenance and repair work.

One of the above-described spaces 40 is provided at each end on the floor of the chamber unit 10, and each has a suitable volume and structure to accommodate the air conditioning means 52, 54, 56. There are a suction port 44 and a discharge port 46 formed in the outer wall of the chamber unit 10 facing the space 40.

Figure 11:
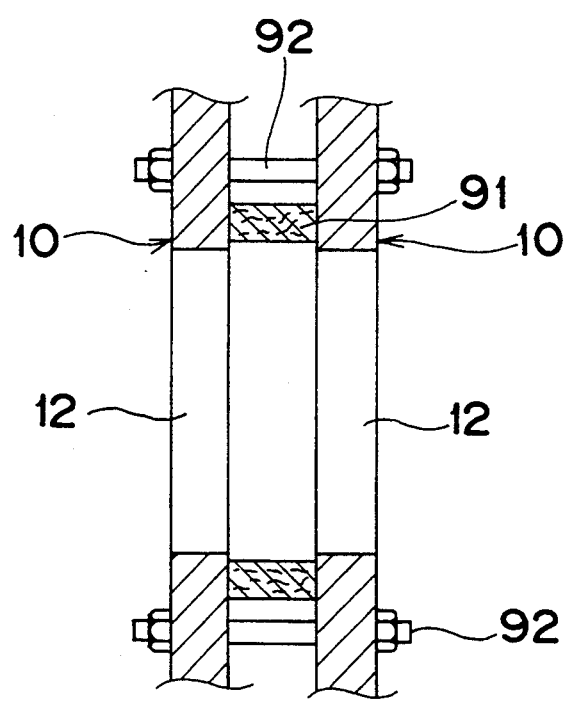
FIG. 11 is an enlarged cross-sectional view showing a connecting means for connecting the chamber units of the first embodiment with each other.

The internal spaces of the chamber units 10 when linearly coupled with each other are communicated through opening sections 12 in the confronting wall surfaces of the chamber units 10. Therefore, when the chamber units 10 are sequentially coupled to one another at the wall surfaces thereof where the opening sections 12 are formed, a clean space tunnel of a desired length can be obtained. At the end of the clean space tunnel, the opening section 12 is closed by a shutter door 14. When the chamber units 10 are linearly coupled with each other, the adjacent chamber units 10 are connected with bolts 92 while a ring-shaped packing 91 is held between them as shown in FIG. 11.

An opening portion 16 is formed in one of the wall faces of the chamber unit 10 orthogonal to the wall faces where the above opening sections 12 are formed, whereby the internal spaces of the chamber unit 10 and a working chamber unit 60 (to be described later) coupled to the chamber unit 10 communicate with each other. The opening portion 16 is also provided with a shutter plate 18 when the working chamber unit 60 is not coupled to the chamber unit 10.

The chamber unit 10 has moving casters 70 and supporting legs 72 extending from a bottom thereof. In the state shown in the drawings, the chamber unit 10 is supported by the supporting legs 72, and fixed in position because the casters 70 are not in touch with the ground. When the clean space is to be constructed or changed in disposition, the operator flips or contracts the supporting legs 72 to bring the casters 70 into contact with the ground, the chamber unit 10 is supported by the casters 70 and becomes freely movable. Accordingly, the unit chamber 10 can be easily moved.

Figure 3:
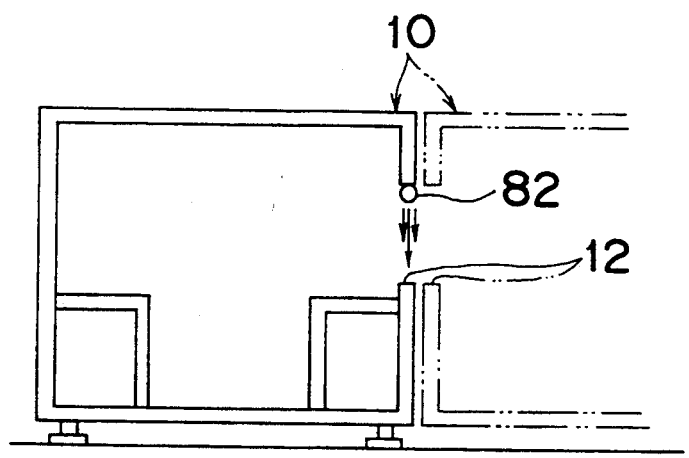
FIG. 3 is a sectional view of a coupling part of the chamber unit of the coupling-type clean space apparatus of the first embodiment.
Figure 9:
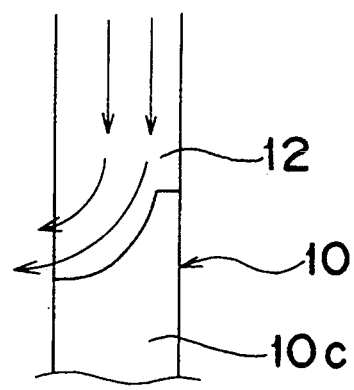
FIG. 9 is an enlarged cross-sectional view of a lower edge of an opening section of a chamber unit according to any of the above embodiments.

FIG. 3 illustrates a coupling part where an air blowhole 82 is formed at the opening section of the chamber unit 10 in the first embodiment. The air blowhole 82 formed of a pipe or the like equipped with nozzle openings is mounted at the upper edge of the opening section 12. The air blowhole 82 may be mounted at the upper edges of both of the adjacent opening sections 12. Purified air is blown out from the air blowhole 82 at all times even when a product is moving from the chamber unit 10 to the adjacent unit chamber 10 to thereby prevent the environment of one chamber unit 10 from influencing the environment in the adjacent chamber unit. The air inside or the air outside of the chamber unit 10 may pass through an air filter and is discharged by a fan so as to blow the purified air through the air blowhole 82. Preferably, the flow direction of the purified air from the air blowhole 82 is generally parallel to the air flow from the air conditioning means, and the flow speed of the purified air from the air blowhole 82 is faster than the air flow speed from the air conditioning means. When the air transversely flows from the air conditioning means, the purified air from the air blowhole 82 preferably flows transversely. As shown in FIG. 9, it is preferable to form a curved surface at the lower edge of the opening section 12 so as to assure that the air from the air blowhole 82 flows towards the inside of the chamber unit 10 to prevent the environment of one chamber unit 10 from influencing the environment in the adjacent chamber unit 10.

Figure 4:
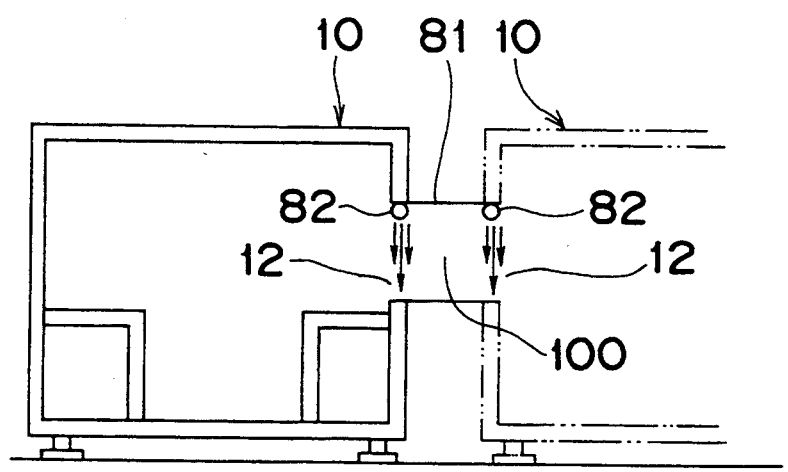
FIG. 4 is a sectional view of a coupling part of a chamber unit of a coupling-type clean space apparatus according to a second embodiment of the present invention.

FIG. 4 shows a second embodiment of the present invention, whereby a space 100 is provided at a coupling part between the coupled chamber units 10. A partition (or duct) 81 connecting the opening sections 12 is in a box-like form and mounted so that the outside air does not enter the inside of the space 100. Since purified clean air is jetted through the air blowhole 82, the environment of the chamber unit 10 is prevented from affecting the next coupled chamber unit 10. The second embodiment is suitable for a case where the adjacent chamber units 10 have different cleanliness levels.

Figure 5:
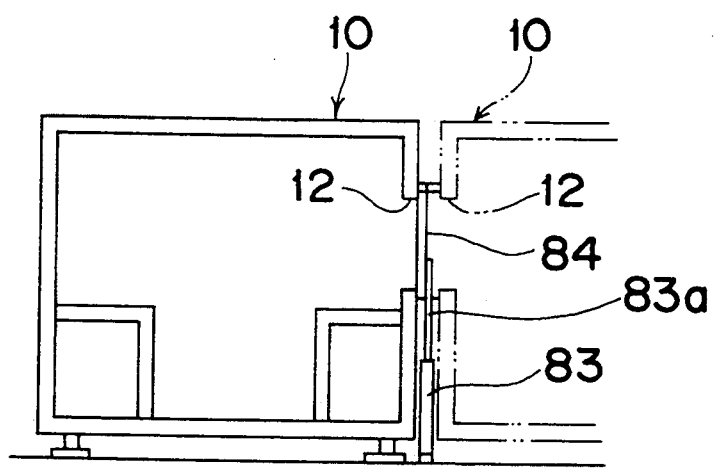
FIG. 5 is a sectional view of a coupling part of a chamber unit of a coupling-type clean space apparatus according to a third embodiment of the present invention.
Figure 6:
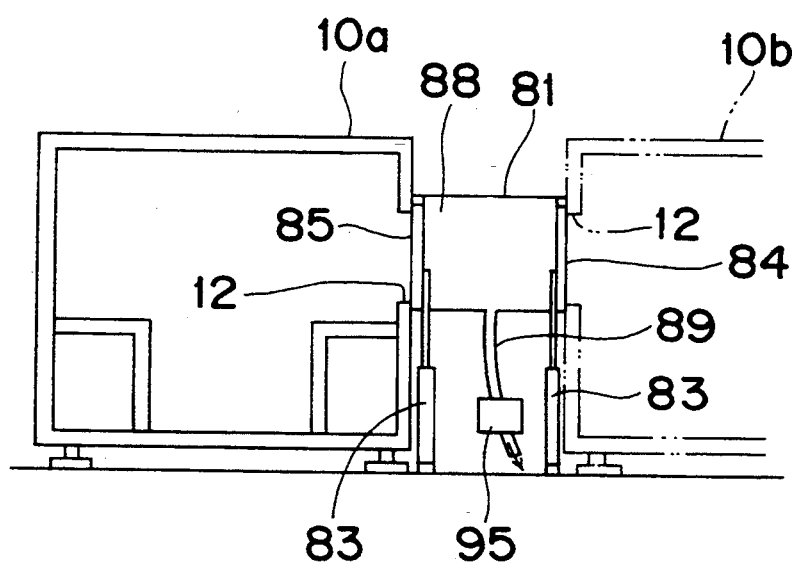
FIG. 6 is a sectional view of a coupling part of a chamber unit of a coupling-type clean space apparatus according to a fourth embodiment of the present invention.
Figure 10:
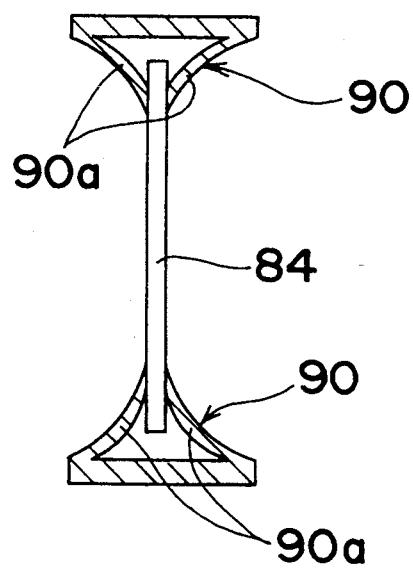
FIG. 10 is an enlarged cross-sectional plan view of a door of the third or fourth embodiment.

FIG. 5 shows a coupling part according to a third embodiment of the present invention, in which a freely openable door 84 is provided between the opening sections 12 of the chamber units 10. Each chamber unit 10 can be completely shut from the other chamber unit by closing the door 84 between the opening sections 12 by using of a cylinder 83 to slide the door linearly, as shown in FIGS. 5 and 6. It is preferable that, as shown in FIG. 10, a sealing member 90 is provided on each side edge of the opening section 12 so as to closely bring each side edge of the door 84 in contact with flexible sealing flaps 90a of the sealing member 90 while allowing the door 84 to slide between the flaps 90a. This allows each chamber unit 10 to be more completely isolated from the other chamber unit. The door 84 may be moved transversely.

In a fourth embodiment of the present invention shown in FIG. 6, the internal spaces of the coupled chamber units 10 are separated by a space 88 having doors 84, 85. The door 85 has the same construction as the door 84. Similar to FIG. 4, a partition 81 is provided in the periphery of the opening sections 12, and has a hose 89 to suck air from within the space 88 through a suction pump 95. When a product is moving from the chamber unit 10a to the chamber unit 10b, the door 85 is opened and the product enters the space 88, then the door 85 is closed. At this time, the air or other gas of the chamber unit 10a which flowed into the space 88 is sucked through the hose 89 by the pump 95. Subsequently, the door 84 is opened to send the product into the chamber unit 10b. In this manner, the product can be moved between the chamber units 10a and 10b without the air or other gas in one chamber unit contaminating the other chamber unit. The embodiments in FIGS. 5 and 6 are preferred over those in FIGS. 3 and 4 for purposes of assuring separation between the chamber units, and can be applied for use with particular atmospheres, e.g., nitrogen atmosphere.

Figure 7:
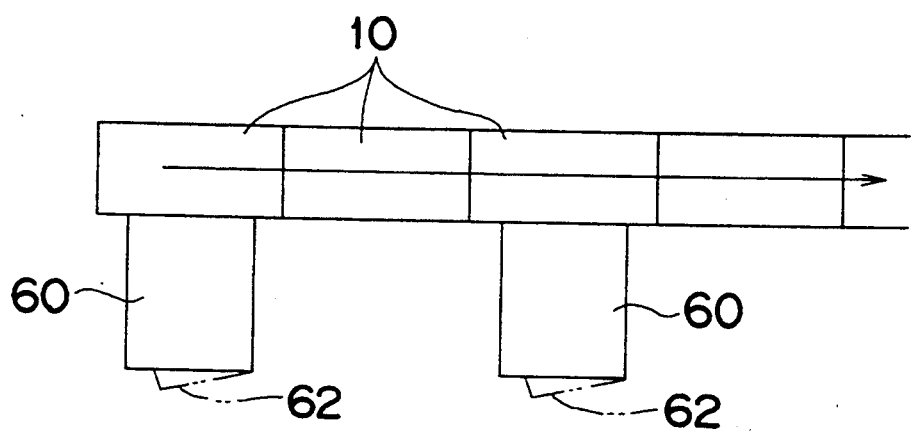
FIG. 7 is a plan view of a coupling arrangement for the chamber units.

FIG. 7 is a plan view of a clean space resulting from many chamber units 10 being coupled linearly to form a clean space tunnel. A product is sequentially transferred in a predetermined direction in the clean space tunnel and processed as desired at every position. If each step of the process can be conducted only inside each chamber unit 10, the clean space tunnel is satisfactory. On the other hand, when the product must at some point be taken out from the transferring course to be subjected to a different process or if relatively large equipment is required, a working chamber unit 60 may be coupled in a direction orthogonal to the linear clean space tunnel.

There is an opening part at an end of the working chamber unit 60 confronting the opening portion 16 of the chamber unit 10, so that the chamber unit 10 communicates with the working chamber unit 60. The working chamber unit 60 is provided with an air circulating means, a dust removing means, and an air conditioner setting means in the same manner as the chamber unit 10. Moreover, the working chamber unit 60 has an entrance/exit with a freely openable door 62, thus allowing the operator to enter the working chamber unit 60.

In some of the coupled chamber units 10 requiring air-conditioning for the operation or the like, suitable air conditioning means 52–56 are set in the spaces 40. However, the space 40 is left unoccupied in the other chamber units 10 where air conditioning means 52–56 are not necessary.

The clean space may be designed freely in layouts other than the illustrated one, in order to accommodate different production line processes by, for example, providing and suitably combining linear parts, branches, and junctions formed of the chamber units 10.

Figure 8:
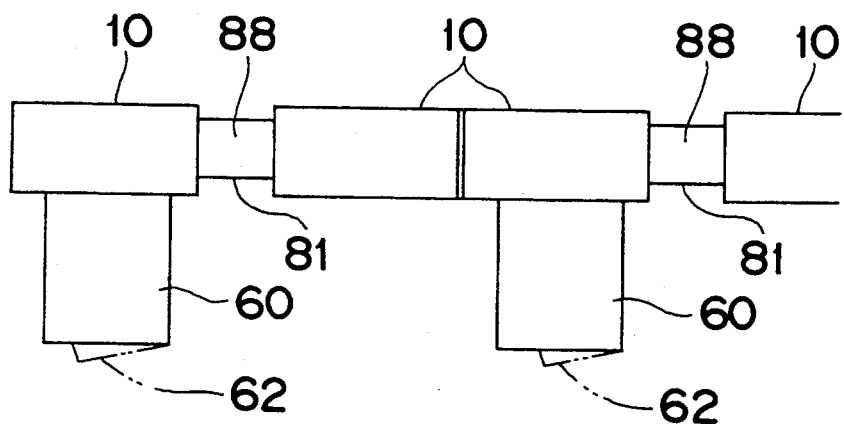
FIG. 8 is a plan view of another coupling arrangement for the chamber units.

Depending on the requirements for the coupled chamber units 10, they may be so arranged as to provide the space 88 having the partition 81 at the connecting part of the chamber units 10, as shown in FIG. 8.

As described hereinabove, in the coupling-type clean space apparatus of the present invention, an air circulating means, a dust removing means, and an air conditioning means may be provided for each unit chamber constituting the clean space apparatus. Therefore, it is easy to provide the chamber units with different environments, even when particular atmospheres, e.g., nitrogen atmosphere, are required. Accordingly, a product can be manufactured under optimum circumstances.

A clean space may be designed freely and easily in the other layout in accordance with the flow of the production line process by suitably combining the chamber units.

Further, since the particular atmosphere of a chamber is secluded inside the chamber unit, the operator can work safely without being exposed to the particular atmosphere.

When the door is used, the atmosphere of one chamber is prevented from adversely influencing the atmosphere of another chamber unit even if the purity of one chamber unit is lowered, that is, the purity of the one chamber unit cannot be maintained as a result of repair work or the like.

According to one embodiment of the present invention, cylindrical chamber units of sizes sufficient to carry out manufacturing operations inside them are sequentially coupled in an axial direction, to thereby form a clean space tunnel or a tubular clean space.

According to another embodiment, the other box-shaped or cylindrical chamber units can be additionally coupled in a direction orthogonal to the axial direction of the above coupled cylindrical chamber units, so that the clean space is formed into a curve or any other desired configuration. A clean room unit of a general coupling-type clean space apparatus can be utilized in the present invention.

The chamber unit has an opening section for communicating with an adjacent chamber unit. For instance, an opening section may be formed at each end of the chamber unit or not only at both ends of the chamber unit, but also in a side orthogonal to the ends in which the opening sections are formed. An air blowhole which is controllable from outside is opened at the opening section. The environments in the coupled chamber units are separated from each other by the air jetted through the air blowhole. The environment can be separated more reliably if a space is provided between the coupled chamber units.

A door is provided at the opening section, which can be opened/closed from outside. Therefore, the environments in the chamber units can be completely segregated. When there are provided a plurality of doors to be alternately opened/closed, the environments in the chamber units can be separated from each other perfectly.

The chamber unit has, as described above, an air circulating means and a dust removing means. The air circulating means is a fan unit or the like, similar to a general clean space apparatus. The air circulating means produces a circulating flow of the air and is controlled in a predetermined manner in the chamber unit. The volume of location of the air circulating means should be so set as to produce suitable circulation of the air only within the volume or the chamber unit. On the other hand, the dust removing means is an air filter or a HEPA filter (high efficiency particulate air-filter), etc. generally used to obtain the clean space. But, other kinds of dust removing means may also be provided. The volume or structure of the dust removing means should also be set to correspond to each chamber unit.

Since an air conditioning means is installed for every chamber unit to control the air in the clean space purified by the air circulating means and the dust removing means, it becomes possible to adjust and control the temperature and humidity in each chamber unit properly. Accordingly, even when it is necessary to provide an individual chamber unit with a different environment because of the kind of process or operation, because the air from the air blowhole forms a wall, the desired environment is realized. Moreover, the space between the adjacent unit chambers makes it possible to separate the chamber units reliably.

Further, the environment in the chamber unit is perfectly confined by the door formed at each opening section. If a plurality of doors are disposed in the space and alternately opened/closed, the products can be transferred through the coupled chamber units without disturbing the environment in each chamber unit.

Although the present invention has been fully described in connection with the preferred embodiments thereof with reference to the accompanying drawings, it is to be noted that various changes and modification are apparent to those skilled in the art. Such changes and modifications are to be understood as included within the scope of the present invention as defined by the appended claims unless they depart therefrom.

What is claimed is:

1. A clean space apparatus comprising:
   a first chamber unit having a first enclosed space therein and including a first wall with a first opening formed therethrough;
   a first air circulating device mounted to said first chamber unit;
   a first dust removal device mounted to said first chamber unit and operably coupled with said first air circulating device;
   a second chamber unit having a second enclosed space therein and including a second wall with a second opening formed therethrough;
   a second air circulating device mounted to said second chamber unit;
   wherein said first and second chamber units are coupled together such that said first opening is aligned with said second opening and said first enclosed space is sequentially communicated with said second enclosed space; and
   wherein an air blowing means is mounted at one of said first and second openings for creating, while said first and second chamber units are coupled together an air curtain substantially parallel to a respective one of said first and second walls and traversing said one of said first and second openings to prevent contaminants from passing from one to the other of said first and second enclosed spaces through said one of said first and second openings.

2. A clean space apparatus as recited in claim 1, further comprising
   a second dust removal device mounted to said second chamber unit and operably coupled with said second air circulating device.

3. A clean space apparatus as recited in claim 1, wherein
   at least one of said first and second chamber units has an additional wall with an additional opening formed therein for communication with an enclosed space of an additional chamber unit.

4. A clean space apparatus as recited in claim 1, further comprising
   a first air conditioner mounted to said first chamber unit in communication with said first air circulating device; and
   a second air conditioner mounted to said second chamber unit in communication with said second air circulating device.

5. A clean space apparatus as recited in claim 1, further comprising
   a duct extending between said first and second openings and communicating said first enclosed space with said second enclosed space.

6. A clean space apparatus as recited in claim 1, wherein
   said first and second chamber units are separate and discrete units respectively defining said first and second enclosed spaces therein.

7. A clean space apparatus as recited in claim 1, further comprising
   first support means for supporting said first chamber unit above a surface; and
   second support means for supporting said second chamber unit above a surface and apart from said first chamber unit.

8. A clean space apparatus as recited in claim 7, wherein
   said first support means comprises at least three legs extending downwardly from a bottom of said first chamber unit; and
   said second support means comprises at least three legs extending downwardly from a bottom of said second chamber unit.

9. A clean space apparatus as recited in claim 1, further comprising
   first moving means for rollingly supporting said first chamber unit and allowing said first chamber unit to be moved along a surface; and
   second moving means for rollingly supporting said second chamber unit and allowing said second chamber unit to be moved along a surface separately from said first chamber unit.

10. A clean space apparatus as recited in claim 9, wherein
    said first moving means comprises at least three casters mounted to a bottom of said first chamber unit; and
    said second moving means comprises at least three casters mounted to a bottom of said second chamber unit.

11. A clean space apparatus comprising:
    a first chamber unit having a first enclosed space therein and including a first wall with a first opening formed therethrough;
    a first air circulating device mounted to said first chamber unit;
    a first dust removal device mounted to said first chamber unit and operably coupled with said first air circulating device;
    a second chamber unit having a second enclosed space therein and including a second wall with a second opening formed therethrough;
    a second air circulating device mounted to said second chamber unit;
    wherein said first and second chamber units are coupled together such that said first opening is aligned with said second opening and said first enclosed space is sequentially communicated with said second enclosed space;
    wherein said first and second chamber units are separate and discrete units respectively defining said first and second enclosed spaces therein; and
    wherein a linearly slidable door is slidably mounted between said first and second openings for movement between open and closed positions to selectively allow said first enclosed space to be completely isolated from said second enclosed space.

12. A clean space apparatus as recited in claim 11, further comprising
a second dust removal device mounted to said second chamber unit and operably coupled with said second air circulating device.

13. A clean space apparatus as recited in claim 11, wherein
at least one of said first and second chamber units has an additional wall with an additional opening formed therein for communication with an enclosed space of an additional chamber unit.

14. A clean space apparatus as recited in claim 11, further comprising
a first air conditioner mounted to said first chamber unit in communication with said first air circulating device; and
a second air conditioner mounted to said second chamber unit in communication with said second air circulating device.

15. A clean space apparatus as recited in claim 11, further comprising
a duct extending between said first and second openings and communicating said first enclosed space with said second enclosed space.

16. A clean space apparatus as recited in claim 15, wherein
said openable and closable door constitutes a first openable and closable door and is mounted adjacent said first opening; and
a second openable and closable door is mounted adjacent said second opening.

17. A clean space apparatus as recited in claim 16, further comprising
a hose connected to said duct and extending outwardly thereof; and
a suction pump operably coupled to said hose for drawing gases through said hose and out of said duct.

18. A clean space apparatus as recited in claim 11, wherein
said openable and closable door constitutes a first openable and closable door and is mounted adjacent said first opening; and
a second openable and closable door is mounted adjacent said second opening.

19. A clean space apparatus as recited in claim 11, further comprising
first support means for supporting said first chamber unit above a surface; and
second support means for supporting said second chamber unit above a surface and apart from said first chamber unit.

20. A clean space apparatus as recited in claim 19, wherein
said first support means comprises at least three legs extending downwardly from a bottom of said first chamber unit; and
said second support means comprises at least three legs extending downwardly from a bottom of said second chamber unit.

21. A clean space apparatus as recited in claim 11, further comprising
first moving means for rollingly supporting said first chamber unit and allowing said first chamber unit to be moved along a surface; and
second moving means for rollingly supporting said second chamber unit and allowing said second chamber unit to be moved along a surface separately from said first chamber unit.

22. A clean space apparatus as recited in claim 21, wherein
said first moving means comprises at least three casters mounted to a bottom of said first chamber unit; and
said second moving means comprises at least three casters mounted to a bottom of said second chamber unit.

* * * * *